United States Patent
Huang (10) Patent No.: US 9,960,070 B2
(45) Date of Patent: May 1, 2018

(54) CHUCKING WARPED WAFER WITH BELLOWS

(71) Applicant: KLA-TENCOR CORPORATION, Milpitas, CA (US)

(72) Inventor: Luping Huang, Dublin, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 256 days.

(21) Appl. No.: 14/683,555

(22) Filed: Apr. 10, 2015

(65) Prior Publication Data

US 2016/0163580 A1    Jun. 9, 2016

Related U.S. Application Data

(60) Provisional application No. 62/088,546, filed on Dec. 6, 2014.

(51) Int. Cl.
| | |
|---|---|
| *H01L 21/683* | (2006.01) |
| *B25B 11/00* | (2006.01) |
| *F16J 3/04* | (2006.01) |
| *H01L 21/687* | (2006.01) |

(52) U.S. Cl.
CPC ........ *H01L 21/6838* (2013.01); *B25B 11/005* (2013.01); *F16J 3/047* (2013.01); *H01L 21/68785* (2013.01)

(58) Field of Classification Search
CPC ........... H01L 21/6838; H01L 21/68785; B25B 11/005; F16J 3/047
See application file for complete search history.

(56) References Cited

U.S. PATENT DOCUMENTS

| | | | |
|---|---|---|---|
| 7,292,427 | B1 | 11/2007 | Murdoch et al. |
| 2005/0011460 | A1 | 1/2005 | Taniguchi |

FOREIGN PATENT DOCUMENTS

| | | | |
|---|---|---|---|
| EP | 0129108 | B1 | 8/1988 |
| JP | 03012948 | A | 1/1991 |
| JP | 10086086 | A | 4/1998 |

OTHER PUBLICATIONS

International Search Report, PCT/US2015/064109, ISA/KR dated Mar. 29, 2016.

*Primary Examiner* — Daniel Howell
*Assistant Examiner* — Paul M Janeski
(74) *Attorney, Agent, or Firm* — Hodgson Russ LLP (57) ABSTRACT

A vacuum chuck has at least one suction assembly that pulls a wafer surface toward a chucking surface. The suction assembly may be used with a wafer that is warped. A suction force engages a pad of a suction assembly with the wafer surface and retracts a bellows of the suction assembly. As the bellows retracts and draws the wafer surface closer to the chucking surface, the suction force provided by the vacuum chuck can pull the wafer flat.

9 Claims, 9 Drawing Sheets

CHUCKING WARPED WAFER WITH BELLOWS

CROSS-REFERENCE TO RELATED APPLICATIONS

This application claims priority to the provisional patent application assigned U.S. App. No. 62/088,546 filed Dec. 6, 2014, the disclosure of which is hereby incorporated by reference in its entirety.

FIELD OF THE DISCLOSURE

This disclosure relates to wafer processing and, more particularly, to chucking warped wafers.

BACKGROUND OF THE DISCLOSURE

Vacuum chucks are commonly used to hold wafers. For example, vacuum chucks can be used to hold semiconductor wafers during inspection or during other periods of wafer manufacturing. Vacuum chucks typically have a chucking surface that contacts the wafer. One or more vacuum grooves extend through this chucking surface. Suction forces retain a wafer on the vacuum chuck when air or another gas is evacuated through the vacuum groove or grooves. A pressure difference between the chucking surface and opposing wafer surface holds the wafer in place during processing or can flatten the wafer against the vacuum chuck.

Not all wafers are perfectly planar. Wafers can become warped. This renders the surface of the wafer curved or otherwise irregular (i.e., non-planar). For example, a point on the surface of a warped wafer can deviate from a reference plane relative to a circumference of the surface. Such warpage may be a result of wafer processing or a result of stress or strain to the wafer. For example, layers or films on the wafer can cause stress or strain that leads to warping.

Sufficiently securing a warped wafer to a vacuum chuck can be difficult. The flatness of the wafer surface affects how well a vacuum chuck can secure a wafer. A vacuum chuck is less effective at securing or flattening a wafer as the distance between the vacuum chuck and the wafer surface increases. Thus, if part of the wafer surface is farther away from the vacuum chuck due to warpage, this part of the wafer surface may not be secured or flattened using the vacuum chuck. An unsecured wafer or wafer that is not properly flattened can affect wafer manufacturing.

In semiconductor applications using metrology systems, some wafers are warped to such a degree that these warped wafers cannot normally be processed or handled by an inspection system. Such wafers may be warped as a result of upstream manufacturing processes (e.g., metal deposition) that change the planar flatness and cause these wafers to be bowl-shaped, dome-shaped, or asymmetrical (twisted). Metrology tools, such as bright field tools, often require substantially flat wafers. Wafers are typically clamped with a chuck to flatten them for metrology or processing. Warped wafers often cannot be clamped on a vacuum chuck to flatten them sufficiently for inspection in a metrology system. Consequently, a significant loss of yield through the metrology system can result from the warping of the wafers.

Vacuum chucks typically can secure a wafer with warpage of up to 0.1 mm. In spite of the 0.1 mm warpage, the wafer can be pulled flat against the chucking surface and sufficiently retained using just the suction force of a vacuum chuck. Chucking of warped wafers with warpage from 0.4 mm to 0.8 mm on a vacuum chuck may be possible in some instances, but this may be limited to particular warpage orientations or wafers with specific backside surface finishes. However, some wafers have warpage greater than 0.8 mm. For example, some wafers have warpage up to approximately 5 mm or 6 mm. Wafers that are warped to such a degree cannot be sufficiently secured to existing vacuum chucks. Therefore, what is needed is a new apparatus and method to chuck warped wafers.

BRIEF SUMMARY OF THE DISCLOSURE

In a first embodiment, a suction assembly is provided. The suction assembly has a base, a bellows, a pad, and a vacuum port. The bellows, which may be fabricated of stainless steel, has a first end and a second end opposite the first end. The second end of the bellows is disposed on the base. The pad, which may be fabricated of a polyimide, has a first surface and a second surface opposite the first surface. The second surface of the pad is disposed on the first end of the bellows. The first surface defines a recess in the pad and the pad includes at least one channel between the first surface and second surface that is defined by a channel wall. The vacuum port is in fluid communication with a first volume and a second volume. The first volume is defined by the base, the bellows, and the pad. The second volume is defined partly by the recess.

A floating part may be disposed between the bellows and the pad. The floating part includes a floating part channel through a floating part body of the floating part defined by a floating part channel wall. The floating part channel is in fluid communication with the channel of the pad. The first volume is further defined by the floating part.

A stop screw may be disposed in the base. The stop screw is adjustable and is configured to provide a stop for the pad when the bellows retracts.

A spring may be disposed between the base and the pad.

A cross-sectional area of the bellows may be greater than a cross-sectional area of the pad. A ratio of the cross-sectional area of the bellows to the cross-sectional area of the pad may be from 1.1:1 to 1.5:1.

In a second embodiment, a vacuum chuck is provided. The vacuum chuck has a body defining a chucking surface with a suction assembly opening defined by the chucking surface. The vacuum chuck also has a suction assembly disposed in the suction assembly opening. The suction assembly has a base, a bellows, a pad, and a vacuum port. The bellows, which may be fabricated of stainless steel, has a first end and a second end opposite the first end. The second end of the bellows is disposed on the base. The pad, which may be fabricated of a polyimide, has a first surface and a second surface opposite the first surface. The second surface of the pad is disposed on the first end of the bellows. The first surface defines a recess in the pad and the pad includes at least one channel between the first surface and second surface that is defined by a channel wall. The vacuum port is in fluid communication with a first volume and a second volume. The first volume is defined by the base, the bellows, and the pad. The second volume is defined partly by the recess. The first surface of the pad is a distance from the chucking surface in a first position and the first surface of the pad is more proximate the chucking surface in a second position than in the first position. The first surface of the pad may be flush with the chucking surface in the second position.

The vacuum chuck may include multiple suction assembly openings and multiple suction assemblies disposed in the suction assembly openings.

A floating part may be disposed between the bellows and the pad. The floating part includes a floating part channel through a floating part body of the floating part defined by a floating part channel wall. The floating part channel is in fluid communication with the channel of the pad. The first volume is further defined by the floating part.

A stop screw may be disposed in the base. The stop screw is adjustable and is configured to provide a stop for the pad when the bellows retracts to the second position.

A spring may be disposed between the base and the pad.

A cross-sectional area of the bellows may be greater than a cross-sectional area of the pad. A ratio of the cross-sectional area of the bellows to the cross-sectional area of the pad may be from 1.1:1 to 1.5:1.

In a third embodiment, a method of chucking is provided. A wafer surface of a wafer is positioned on a chucking surface of a vacuum chuck. Less than an entirety of the wafer surface contacts the chucking surface. The vacuum chuck comprises a suction assembly that includes a bellows and a pad. A pressure of a volume inside the bellows and a recess of the pad connected to the bellows is lowered such that the pad engages the wafer surface and the bellows retracts thereby rendering the wafer surface less non-planar.

The vacuum chuck may include multiple suction assemblies. Thus, a pressure may be lowered in multiple volumes and recesses so that multiple pads engage the wafer surface and multiple bellows retract.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure.

The present disclosure provides a system and method of chucking a wafer. A wafer, which may be warped, is placed on a chucking surface of a vacuum chuck. The chucking surface may be substantially planar. The vacuum chuck has at least one suction assembly that can contact or otherwise engage the wafer surface. The suction assembly includes a base, a flexible bellows disposed on the base, and a pad disposed on the flexible bellows.

In an embodiment, each suction assembly has a pad connected to a flexible bellows. The pad engages the wafer surface. An aperture in the pad enables a lower pressure to form in a recess of a surface of the pad. The flexible bellows retracts as lower pressure is formed inside the bellows. This moves the pad between a first position above the chucking surface to a second position closer to the chucking surface. This second position may be approximately flush with the chucking surface.

The suction assembly disclosed herein can be used to close a gap between a chucking surface and a wafer surface to help secure the wafer using the vacuum chuck. The lower pressure and resulting suction that is formed inside the bellows and in the recess connects or engages the pad of the suction assembly with the wafer surface and retracts the bellows. As the bellows retracts and draws the wafer surface closer to the chucking surface, the suction force provided by the vacuum chuck can secure the wafer or pull the warped wafer flat against the chucking surface.

Figure 1:
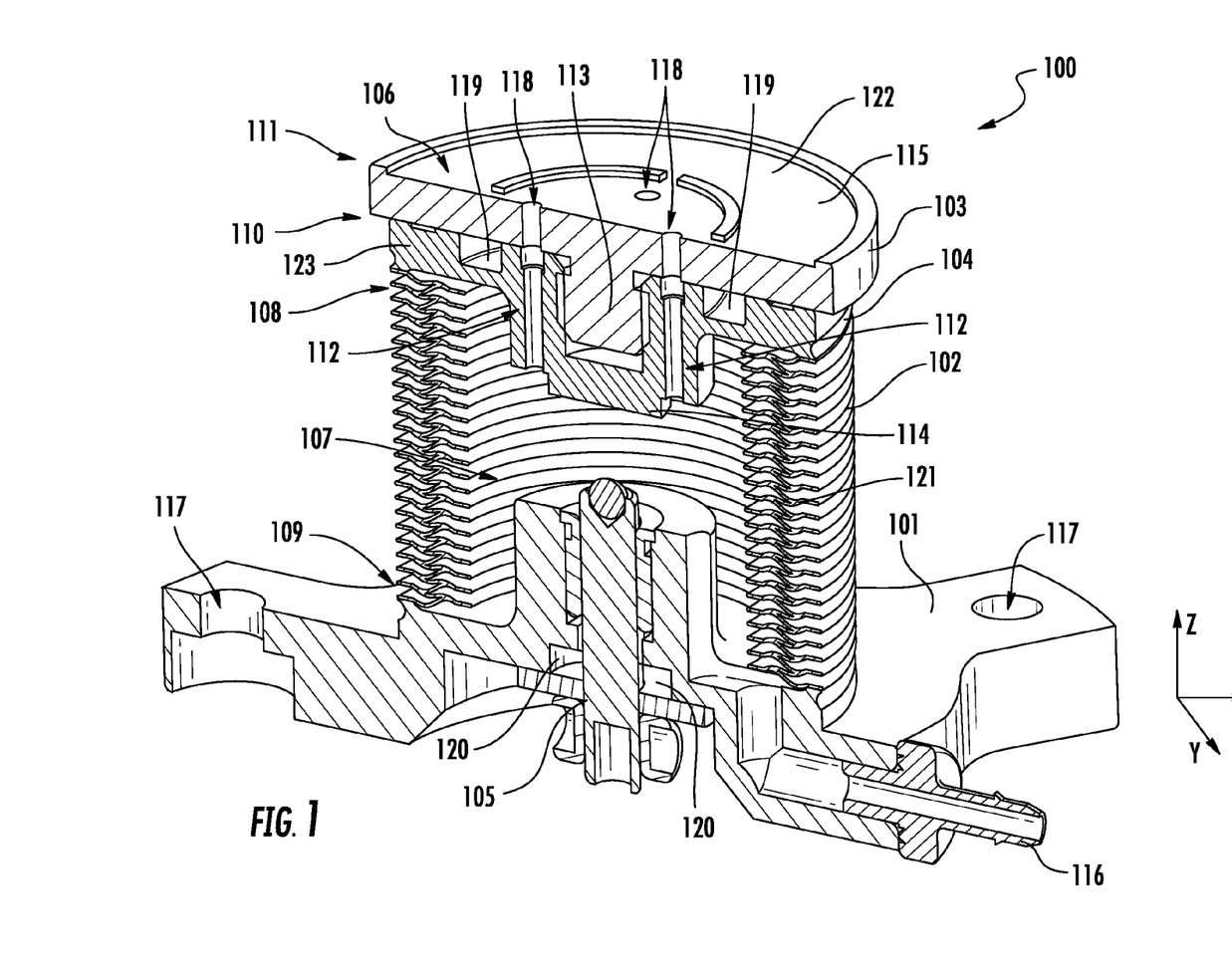
FIG. 1 is a cross-sectional view of a first embodiment of a suction assembly in accordance with the present disclosure.

FIG. 1 is a cross-sectional view of a first embodiment of a suction assembly 100. A base 101 is configured to be mounted or connected to a body of a vacuum chuck and can be fabricated of metal, plastic, or other materials known in the art. The base 101 can include securing holes, clips, or other mechanisms to secure the base 101 or suction assembly 100 to a vacuum chuck. For example, FIG. 1 illustrates two securing holes 117 in the base 101 that enable a fastener, such as a bolt or screw, to secure the base 101 to an air bearing spindle in a vacuum chuck. More or fewer securing holes 117 are possible. The base 101 can be fabricated of stainless steel, such as stainless steel 316L, or other materials.

Connected to the base 101 is a bellows 102. The bellows 102 has a first end 108 and a second end 109. The second end 109 is disposed on the base 101. The bellows 102 can be fabricated of stainless steel or other materials. Stainless steel can provide durability and can resist fatigue due to operation of the bellows 102. The walls 121 of the bellows 102 define a first volume 107 with the base 101 and the pad 103. The first volume 107 is inside the bellows 102. The length of the bellows 102 in the z-direction can vary depending on the desired operation of the suction assembly 100.

The bellows 102 is resilient. The k-factor of the bellows 102 enables the bellows 102 to retract in the z-direction. However, the bellows 102 is relatively rigid with respect to flexure in the x-direction or y-direction. Thus, any inward collapse by the walls 121 of the bellows 102 when pressure is lowered in the first volume 107 will be reduced or prevented and the bellows 102 will primarily or only retract toward the base 101 in the z-direction. This rigidity in the x-direction and y-direction may be provided by the structural components of the bellows 102 at the first end 108 and second end 109 of the bellows 102. Such structural components may be more rigid or less flexible than the rest of the bellows 102.

The bellows 102 can fully retract in the z-direction to a point where it is not capable of further retraction. Before being fully retracted, the bellows 102 may collapse or otherwise translate in the x-direction or y-direction. Any collapse or other translation in the x-direction or y-direction is typically smaller than retraction in the z-direction.

The distance the bellows 102 can translate in the z-direction can vary. Factors such as diameter, pitch, total length, thickness of each component, or material can affect a distance that the bellows 102 can translate in the z-direction.

Connected to the bellows 102 is a pad 103. The pad 103 has a first surface 111 and second surface 110. The second surface 110 of the pad 103 is disposed on the first end 108 of the bellows 102. The pad 103 may be disposed directly on the bellows 102 or, if present, the floating part 104 may be positioned between the pad 103 and bellows 102. Other components or layers also may be disposed between the pad 103 and the bellows 102. The pad 103 has a recess 115 defined by the first surface 111. A second volume 106 is defined by the recess 115 together with a wafer surface when a wafer is present. As seen in, for example, FIG. 6, the second volume 106 can be bounded by a wafer surface in contact with the pad 103.

The shape of the recess 115 or first surface 111 of the pad 103 can vary. The first surface 111 or recess 115 can be shaped to enable vacuum to be initiated and held during operation of the suction assembly 100. To avoid separation between the pad 103 and the wafer when the bellows 102 retracts, the vacuum suction area of the pad 103 may be greater than the effective vacuum suction area formed by the bellows 102. The pad 103 vacuum suction area may have sufficient support with respect to a wafer surface to prevent excessive deformation caused by the suction. The first surface 111 can include ridges, as seen in FIG. 1, can be bowl-shaped, or can be other shapes.

The pad 103 may be fabricated of plastic. In one example, the pad 103 may be fabricated of a polyimide-based plastic, such as VESPEL (manufactured by DuPont). The pad 103 also may be fabricated of ERTALYTE (manufactured by Quadrant Plastics), polyether ether ketone (PEEK), VITON (manufactured by DuPont), or other materials known to those skilled in the art. The material in the pad 103 may have low outgassing properties. Outgassing, particulation, or a coefficient of friction of the pad 103 material may be selected for particular operation of the suction assembly 100.

The pad 103 can conform to a wafer surface engaged or otherwise in contact with the pad 103. For example, when suction is applied, the pad 103 may compress and its surface may conform to the wafer surface. This can help form a seal between the pad 103 and the wafer surface to assist in maintaining the suction force in the recess 115 or second volume 106.

The first surface 111 of the pad 103 can have a diameter in the x-direction or y-direction from approximately 10 mm to approximately 50 mm. In a specific example, the first surface 111 of the pad 103 has a diameter in the x-direction or y-direction of approximately 24 mm. Other dimensions are possible and this is merely listed as an example.

The pad 103 has at least one channel 118 between the first surface 111 and second surface 110. This channel 118 is defined by a channel wall of the body 122 of the pad 103. Three channels 118 are illustrated in FIG. 1. However, more or fewer channels 118 may be used. A pad 103 may have between one and six channels in an instance. For example, only one channel 118 may be used in the pad 103. The dimensions of a channel 118 can be configured to restrict air flow. Such air flow restriction can be used to control the pressure inside the bellows 102 to control the height of the bellows 102 in the z-direction prior to engagement with a wafer.

The pad 103 may have properties that enable it to hold its shape in spite of the lower pressure in the first volume 107. In this embodiment, the pad 103 can be disposed directly on the bellows 102 or reinforcement of the pad 103 can otherwise be avoided.

The suction assembly 100 may include a floating part 104 disposed between the bellows 102 and pad 103. For example, the floating part 104 may reinforce the pad 103 against the lower pressure in the first volume 107. The pad 103 is on one side of the floating part 104 and the bellows 102 is on the other side of the floating part 104. Both the pad 103 and bellows 102 may be directly connected to the floating part 104. The floating part 104 further defines the first volume 107. Thus, with the floating part 104, the walls 121 of the bellows 102 define a first volume 107 with the base 101 and the floating part 104.

The floating part 104 may be fabricated of a material that enables fusing, bonding, or connection with the bellows 102. For example, the floating part 104 may be fabricated of the same material as the bellows 102. The floating part 104 may have material properties that provide support for the pad 103 while minimizing deformation of the pad 103.

The floating part 104 includes at least one floating part channel 112 through the floating part body 123. The floating part channels 112 are defined by a floating part channel wall. The floating part channels 112 are in fluid communication with the channels 118 of the pad 103.

The number of floating part channels 112 can match or be different from the number of channels 118 in the pad 103. Thus, more or fewer floating part channels 112 may be used than those illustrated in FIG. 1.

An o-ring 119 can be positioned between the pad 103 and floating part 104. The floating part 104 may include a recess for the o-ring 119. The o-ring 119 may help prevent leaks from the floating part channels 112 and channels 118.

A connection between the base 101, bellows 102, pad 103, or floating part 104 may include a glue or adhesive, screw fit, o-ring, press-fit, or another seal-forming mechanism so that the lower pressure can be held in or suction can be applied to the first volume 107 and second volume 106 while minimizing leaks.

The suction assembly 100 also can have a stop screw 105, which can be a setscrew. The stop screw 105 is positioned in the base 101 and is adjustable. The stop screw 105 provides a stop for the pad 103 when the bellows 102 retracts. The number of stop screws 105 can vary and the suction assembly 100 is not limited to merely one stop screw 105. The stop screw 105 can be adjusted while the suction assembly 100 is in a vacuum chuck, while the suction assembly 100 is separate from the vacuum chuck, or when removed from the suction assembly 100.

The stop screw 105 can be adjusted to prevent the bellows 102 from retracting too much or too little and, consequently, the pad 103 from moving too much or too little. In an example, a chucking surface of a vacuum chuck is placed on a flat surface. This retracts the bellows 102 and positions the first surface 111 of the pad 103 flush with the chucking surface of the vacuum chuck. The stop screw 105 is then adjusted until the stop screw 105 touches or otherwise engages the pad 103 or floating part 104. This will set the stop screw 105 to provide a stop for the pad 103 such that the pad 103 will be flush with the chucking surface as the bellows 102 retracts.

An o-ring 120 may be positioned around the stop screw 105. The base 101 may include a cavity to hold the o-ring 120. This o-ring 120 may help maintain the lower pressure within the first volume 107.

Other mechanisms that provide a stop for the pad 103 when the bellows 102 retracts besides the stop screw 105 are possible. For example, a differential adjustment screw can be used. This may provide a resolution of approximately 25 µm per revolution.

A vacuum port 116 is in fluid communication with the first volume 107 and, through the floating part channels 112 and channels 118, the second volume 106. In the embodiment of FIG. 1, the vacuum port 116 is located in the base 101 with a channel leading to the first volume 107. The vacuum port 116 may have different configurations or positions than that illustrated in FIG. 1. The vacuum port 116 can be connected with a vacuum pump.

The pad 103 may have a projection 113 on the second surface 110 that extends beyond a plane of the second surface 110. This projection 113 contacts or otherwise engages the stop screw 105 when the bellows 102 retracts. This projection 113 may be in the center of second surface 110, though the projection 113 may be in other locations or have other configurations.

If the floating part 104 is used, the floating part 104 may have a floating part projection 114. This floating part projection 114 may cover or surround the projection 113 in the pad 103, if present. The position or configuration of the floating part projection 114 may substantially match that of the projection 113 or may be different. The floating part projection 114 may directly contact the stop screw 105 when the bellows 102 retracts.

During operation, the degree of suction in the second volume 106 defined by the recess 115 of the pad 103 may be greater than the degree of suction in the first volume 107 defined by the bellows 102. This enables the pad 103 to remain engaged with the wafer. This also prevents the retraction of the bellows 102 that pulls the pad 103 away from the wafer surface from breaking the engagement between the wafer surface and the pad 103. The vacuum force is measured by the pressure multiplied by suction area. During normal operation, the pressure may remain approximately the same in the first volume 107 and second volume 106. The difference of the vacuum forces may be determined by the suction areas.

To provide a higher degree of suction in the second volume 106 defined by the recess 115 of the pad 103 than the degree of suction in the first volume 107 defined by the bellows 102, the cross-sectional area of the bellows 102 versus the pad 103 or the size of the channel 118 in the pad 103 can vary. A cross-sectional area of the bellows 102 can be greater than a cross-sectional area of the pad 103 to enable the pad 103 to remain engaged with a wafer surface without retraction of the bellows 102 interrupting the engagement. The ratio of the cross-sectional area of the bellows 102 to the cross-sectional area of the pad 103 can be from approximately 1.1:1 to approximately 1.5:1, though other ratios are possible. In an example, the ratio of the cross-sectional area of the bellows 102 to the cross-sectional area of the pad 103 can be approximately 1.2 to 1. This ratio may vary based on the stiffness of the wafer.

Figure 2:
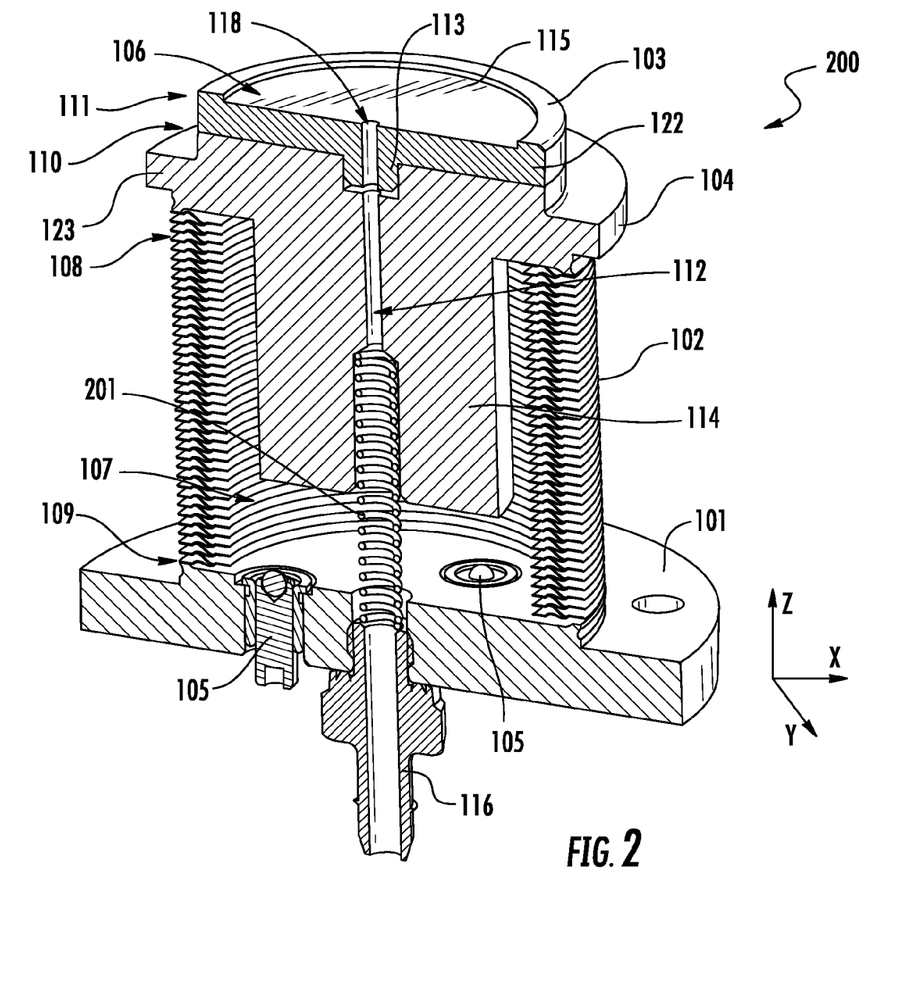
FIG. 2 is a cross-sectional view of a second embodiment of a suction assembly in accordance with the present disclosure.

FIG. 2 is a cross-sectional view of a second embodiment of a suction assembly 200. The suction assembly 200 has a base 101, bellows 102, optional floating part 104, pad 103, stop screws 105, and a vacuum port 116.

The pad 103 has a recess 115 defined by the first surface 111. This recess 115 defines a second volume 106 together with a wafer surface when the wafer is present. As seen in, for example, FIG. 6, the second volume 106 can be bounded by a wafer surface in contact with the pad 103. The pad 103 has at least one channel 118 between the first surface 111 and second surface 110. This channel 118 is defined by a channel wall of the body 122 of the pad 103. While one channel 118 is illustrated in FIG. 2, more than one channel 118 may be used.

In some embodiments, a floating part 104 is between the pad 103 and bellows 102. The floating part 104 includes at least one floating part channel 112 through the floating part body 123. The floating part channel 112 is defined by a floating part channel wall. The floating part channel 112 is in fluid communication with the channel 118 of the pad 103. The number of floating part channels 112 in the floating part 104 may be the same as or different from the number of channels 118 in the pad 103.

The bellows 102 has a first end 108 and a second end 109. The walls 121 of the bellows 102 define a first volume 107 with the base 101 and the pad 103 (or floating part 104, if present). The first volume 107 is inside the bellows 102.

A spring 201 is positioned between the base 101 and the floating part 104. In an embodiment, the spring 201 is positioned in the first volume 107 of the bellows 102. This spring 201 resists retraction of the bellows 102 and helps urge the bellows 102 away from the base 101. In the embodiment of FIG. 2, the spring 201 is partially positioned within the base 101 and the floating part 104 to secure the spring 201. The spring 201 also may be positioned against a planar surface of the base 101 or floating part 104 without being partially positioned within the base 101 or the floating part 104.

In the embodiment of FIG. 2, the spring 201 is positioned against the vacuum port 116. In an example, the vacuum port 116 is metal, which can provide rigid support for the spring 201. In another embodiment, the spring 201 is positioned against the base 101 at a point away from the vacuum port 116. The vacuum port 116 can be connected with a vacuum pump.

In another embodiment, the floating part 104 is not present and the spring 201 is positioned between the base 101 and the pad 103. In this embodiment, the spring 201 may be positioned on the second surface 110 of the pad 103 or partially within the pad 103.

The embodiment of FIG. 2 has three stop screws 105, though only two are illustrated due to the cross-section. The number of stop screws 105 can vary. For example, one or two stop screws 105 can be used, though more stop screws 105 also can be used. The stop screws 105 may all be adjusted to approximately the same height in the z-direction so that the pad 103 is level with respect to or parallel to a chucking surface of a vacuum chuck. The stop screws 105 also may be adjusted to different heights in the z-direction. This can change the angle of the pad 103 with respect to a chucking surface of a vacuum chuck, such as to assist the pad 103 in engaging a wafer surface.

In another embodiment, the suction assembly 100 of FIG. 1 or suction assembly 200 of FIG. 2 does not include any stop screws. In an instance, the bellows can fully retract to a minimum length in the z-direction to make the first surface of the pad approximately flush with a chucking surface of a vacuum chuck. In another instance, the bellows may not fully retract to its minimum length in the z-direction when the first surface of the pad is approximately flush with a chucking surface of a vacuum chuck. In this instance, the material properties of the wafer halts further retraction of the bellows when the wafer contacts the chucking surface. Thus, while the bellows is urged to retract due to suction, retraction is halted by the wafer when it contacts the chucking surface.

Figure 3:
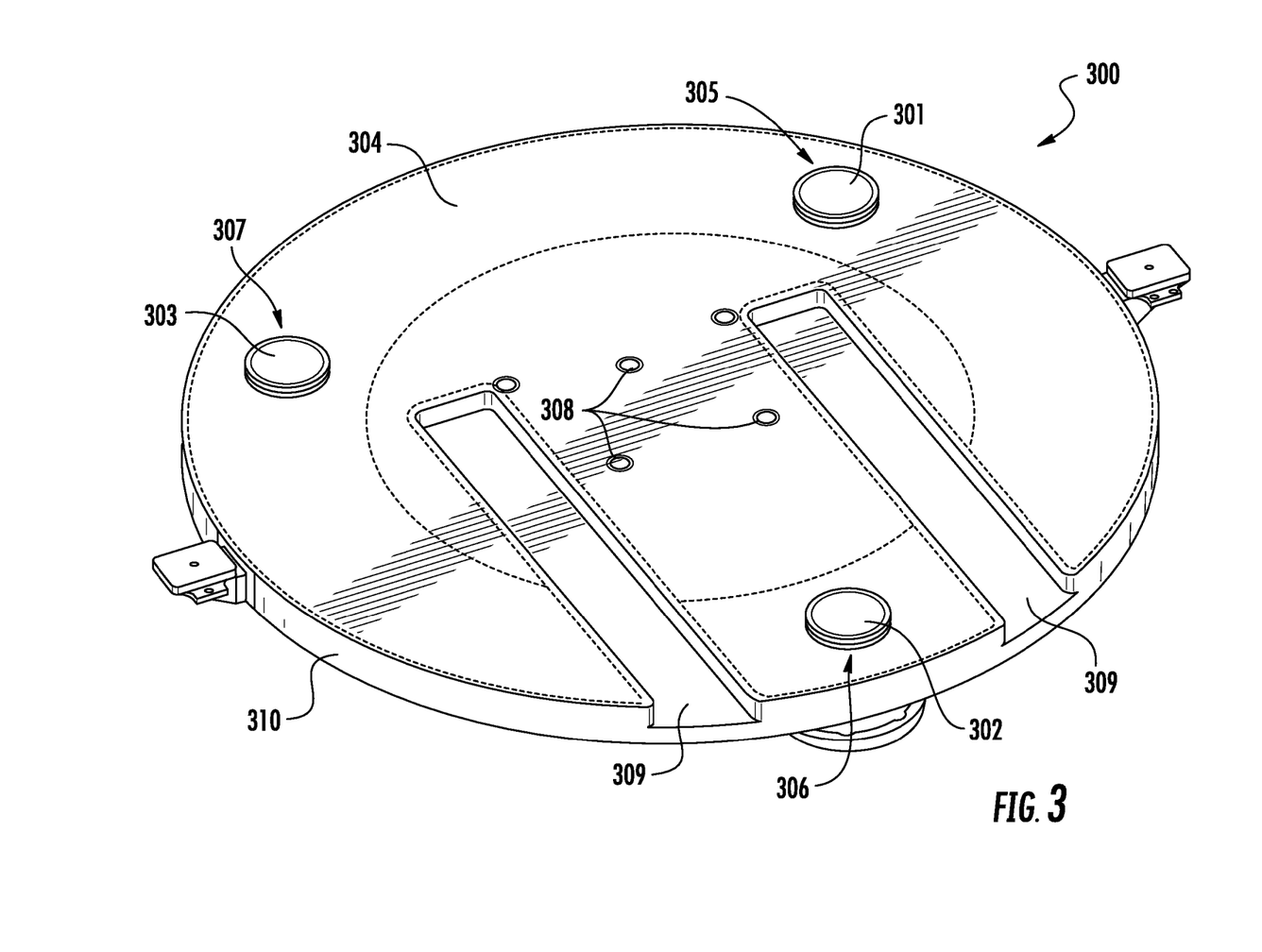
FIG. 3 is a top perspective view of a vacuum chuck including suction assemblies.

FIG. 3 is a top perspective view of a vacuum chuck 300 including suction assemblies 301-303. The suction assemblies 301-303 can correspond to, for example, the suction assembly 100 or 200 in FIG. 1 or 2.

The vacuum chuck 300 in FIG. 3 has a body 310 that defines a chucking surface 304. A wafer is placed on this chucking surface 304 during chucking. The chucking surface 304 can be substantially planar. While not illustrated, rounded bumps may be distributed across the chucking surface 304 to reduce contact stress with the backside of a wafer.

The vacuum chuck 300 has one or more vacuum inlets located in the chucking surface 304 to evacuate air or gas from the space between a wafer surface and the chucking surface 304. This evacuation applies a chucking force and can retain or secure a wafer to the vacuum chuck 300.

In FIG. 3, the vacuum chuck 300 has three suction assembly openings 305-307 defined by the chucking surface 304. One of the suction assemblies 301-303 is positioned in each of suction assembly openings 305-307. Each of the suction assembly openings 305-307 can be part of a hole through the entire body 310 of the vacuum chuck 300 or can be a cavity in the body 310 of the vacuum chuck 300 having a bottom surface.

The vacuum chuck 300 may include lift pins 308 that can raise or lower a wafer relative to the chucking surface 304. A lifting mechanism (not illustrated) is configured to lift the heads of the lift pins 308 above the chucking surface 304 and to lower the lift pins 308 into or below the chucking surface 304. Grooves 309 may be formed in the body 310 of the vacuum chuck 300 to enable a robot end effector to be inserted between the wafer and the vacuum chuck 300. The robot end effector can place a wafer on or remove a wafer from the vacuum chuck 300.

The size of the suction assemblies can vary. For example, a diameter of the suction assemblies can be from approximately 10 mm to approximately 50 mm depending on the wafer size, warpage, or wafer stiffness.

The number of suction assemblies can vary. Though three suction assemblies 301-303 are illustrated, the number of suction assemblies can be from, for example, one to twenty. Depending on the size of the suction assemblies and the size of the chucking surface, more than twenty suction assemblies can be used. In an example, twelve suction assemblies can be used with the vacuum chuck 300. The suction assemblies used with the vacuum chuck 300 can be equally spaced around the vacuum chuck 300 or in other patterns. The number of suction assemblies and the positions of the suction assemblies can vary based on a wafer's degree of warpage, shape of warpage, stiffness, surface finish, or other factors.

The number of suction assemblies can be the same as the number of suction assembly openings. In another embodiment, there are more suction assembly openings than suction assemblies in the vacuum chuck. In such a configuration, the suction assemblies can be optimally positioned in the vacuum chuck for a particular wafer.

In an embodiment, a group of suction assemblies is clustered together in a single region of the vacuum chuck 300 rather than being equally spaced around the vacuum chuck 300 as seen in FIG. 3.

In another embodiment, a single suction assembly can be used with the vacuum chuck 300. In this embodiment, a wafer is warped such that, for example, only one region of the wafer surface is not in contact with the chucking surface 304. A single suction assembly can be used to draw this region down and then the suction force of the vacuum chuck is sufficient to clamp the wafer or render the wafer planar or otherwise less warped.

Figure 4:
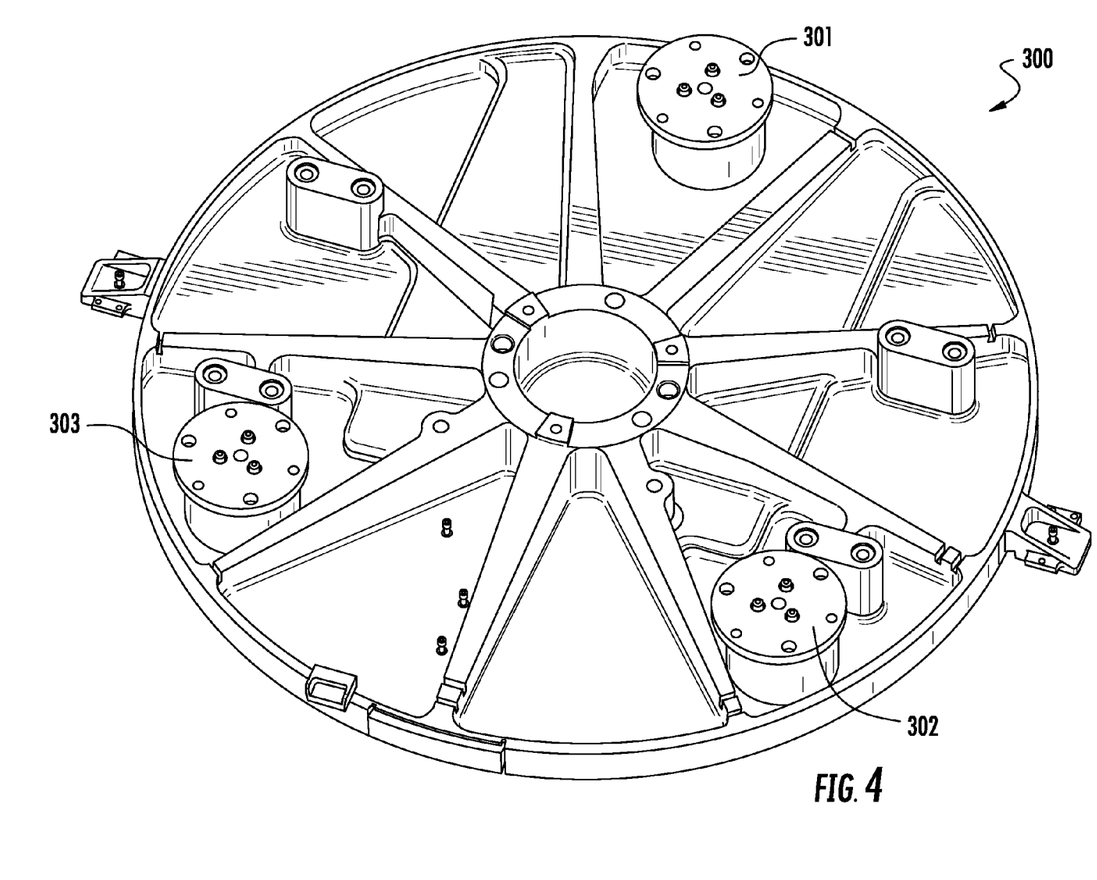
FIG. 4 is a bottom perspective view of part of a vacuum chuck corresponding to the vacuum chuck of FIG. 3.

FIG. 4 is a bottom perspective view of part of a vacuum chuck corresponding to the vacuum chuck of FIG. 3. In FIG. 4, the suction assemblies 301-303 are connected with the vacuum chuck 300. For example, the suction assemblies 301-303 can be screwed into the vacuum chuck 300 using an aperture in the base of each.

Figure 5:
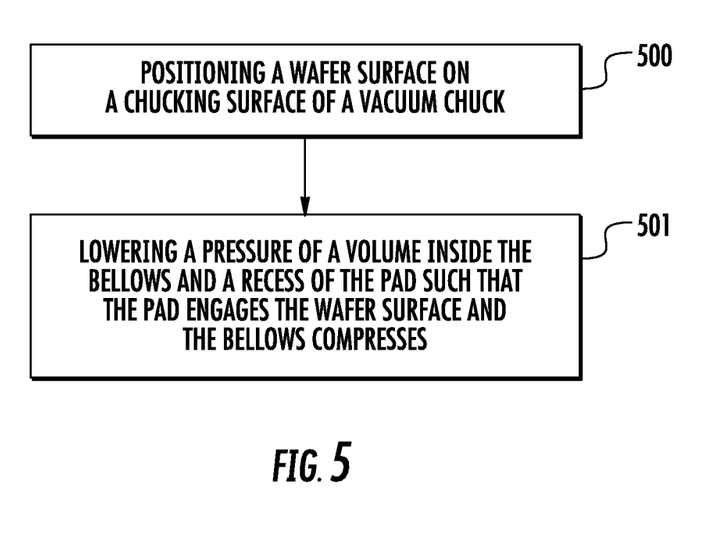
FIG. 5 is a flowchart of a method in accordance with the present disclosure.

FIG. 5 is a flowchart of a method in accordance with the present disclosure. In 500, a wafer surface is positioned on a chucking surface of a vacuum chuck having at least one suction assembly. Each suction assembly includes a bellows and a pad. The vacuum chuck may be, for example, the vacuum chuck 300 in FIG. 3. Less than an entirety of the wafer surface may contact the chucking surface. Thus, the wafer may be non-planar because it is warped.

In 501, a pressure of a volume inside the bellows and a recess of the pad connected to the bellows is lowered. The pad engages with the wafer surface and the bellows retracts. The wafer surface is pulled toward the chucking surface, thereby rendering the wafer surface less non-planar.

Multiple suction assemblies, each with a bellows and a pad, may be used. In this embodiment, a pressure is lowered in multiple volumes inside the bellows and the recesses of the pads. The pads attach to the wafer surface at multiple points and the bellows retract. The wafer surface is pulled toward the chucking surface at the multiple points, thereby rendering the wafer surface less non-planar. The pads may attach to the wafer at the same or different times. For example, as part of the wafer is pulled toward the chucking surface at one point on the wafer surface using a first pad, then a different pad may attach to the wafer surface at a different point after the bellows attached to the first pad retracts. Thus, pulling the wafer toward the chucking surface in one area can cause a suction assembly in another area to engage the wafer surface.

A suction assembly may not retract or may retract at a slower rate if no wafer is engaged with a pad of the suction assembly. This may enable a suction assembly to stay in or near a first position to engage a wafer while the wafer is otherwise pulled toward the chucking surface.

A vacuum pump can provide suction to both the vacuum chuck and the suction assembly or suction assemblies. The vacuum pressure range of the vacuum pump can be from approximately 0 atm to approximately −29.9 inches of Hg. This vacuum pump can provide, for example, 24 inches Hg of suction or 1 atm of suction, though the vacuum pump can provide other amounts or ranges of suction.

The vacuum pump can actuate the suction assemblies. Starting or stopping the suction to the vacuum chuck or a suction assembly enables the suction assembly to engage a wafer surface and the bellows to retract. Suction is applied to the first volume of the bellows and second volume of the pad through, for example, a vacuum port. Suction to the second volume can be applied from the first volume through at least one channel in the pad. The bellows retracts as a lower pressure is provided in the first volume. The pad engages a wafer surface as a lower pressure is provided in the second volume.

Additional mechanical actuating devices may not be needed to pull the pad of the suction assembly toward the chucking surface. Avoidance of mechanical actuating devices can ensure high reliability, lower cost, and reduce necessary maintenance.

Two or more suction pumps also can be used. In an embodiment, one or more vacuum pumps provide suction to the suction assemblies. These vacuum pumps are separate from those that supply suction to the vacuum chuck. In this embodiment, a controller may be used to control the timing of when the suction is provided to the suction assemblies and the vacuum chuck.

Valves also may be used to control when the suction is provided to the suction assemblies or the vacuum chuck. The valves may be, for example, solenoid valves. In an embodiment, one or more vacuum pumps provide suction to the suction assemblies and the vacuum chuck. A controller may be used to control the valves, which in turn control when suction is provided to the individual suction assemblies or the vacuum chuck.

Providing a stop for the pad when the bellows retracts can prevent a wafer from being pulled into a suction assembly opening in the chucking surface. A thin wafer can deflect or bend if a suction assembly pulls the wafer into the suction assembly opening. Such a deflection or bend can affect, for example, whether the wafer surface is properly in focus during inspection.

Figure 6:
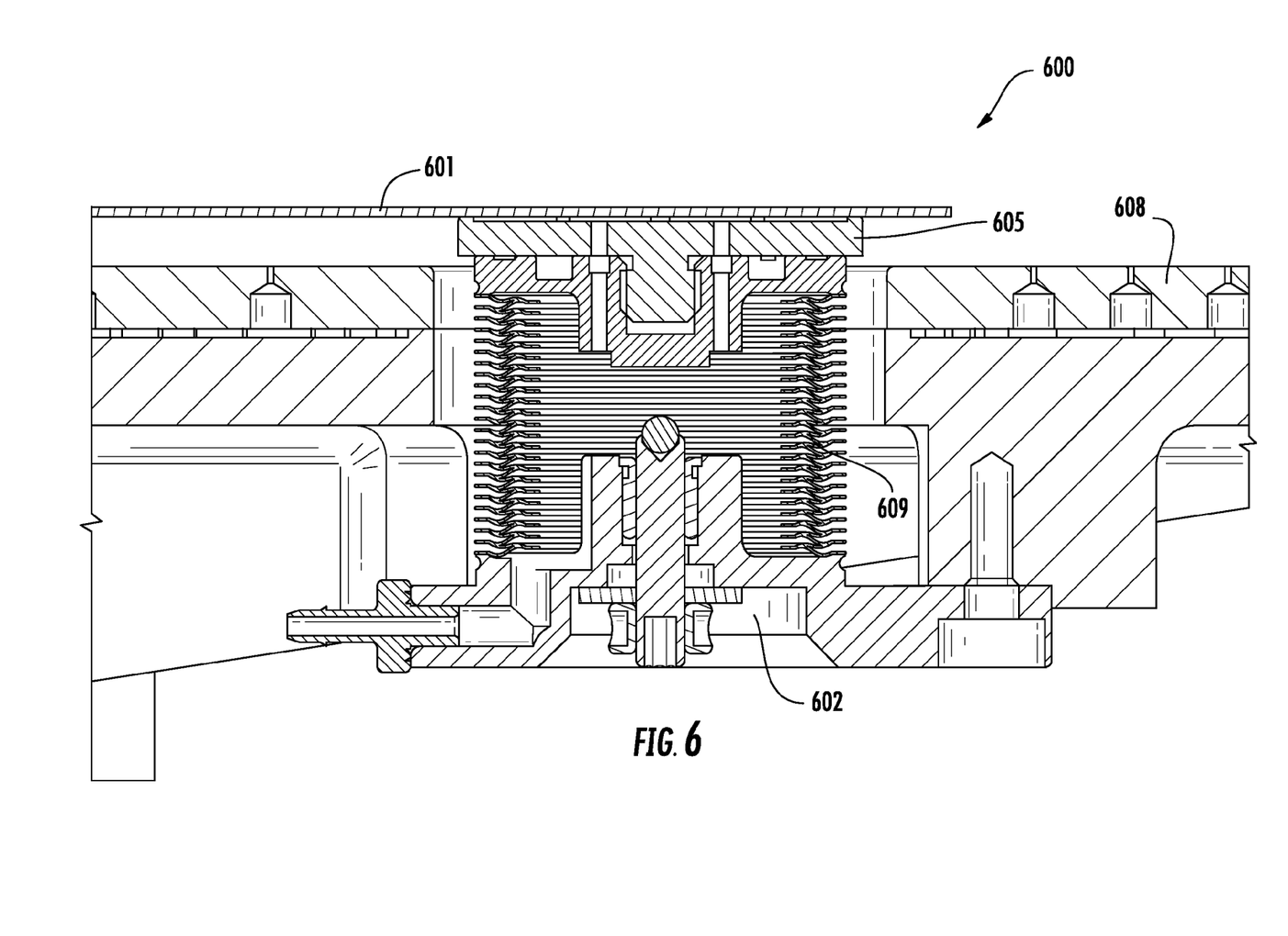
FIG. 6 is a cross-sectional view of a suction assembly in a vacuum chuck in a first position.
Figure 7:
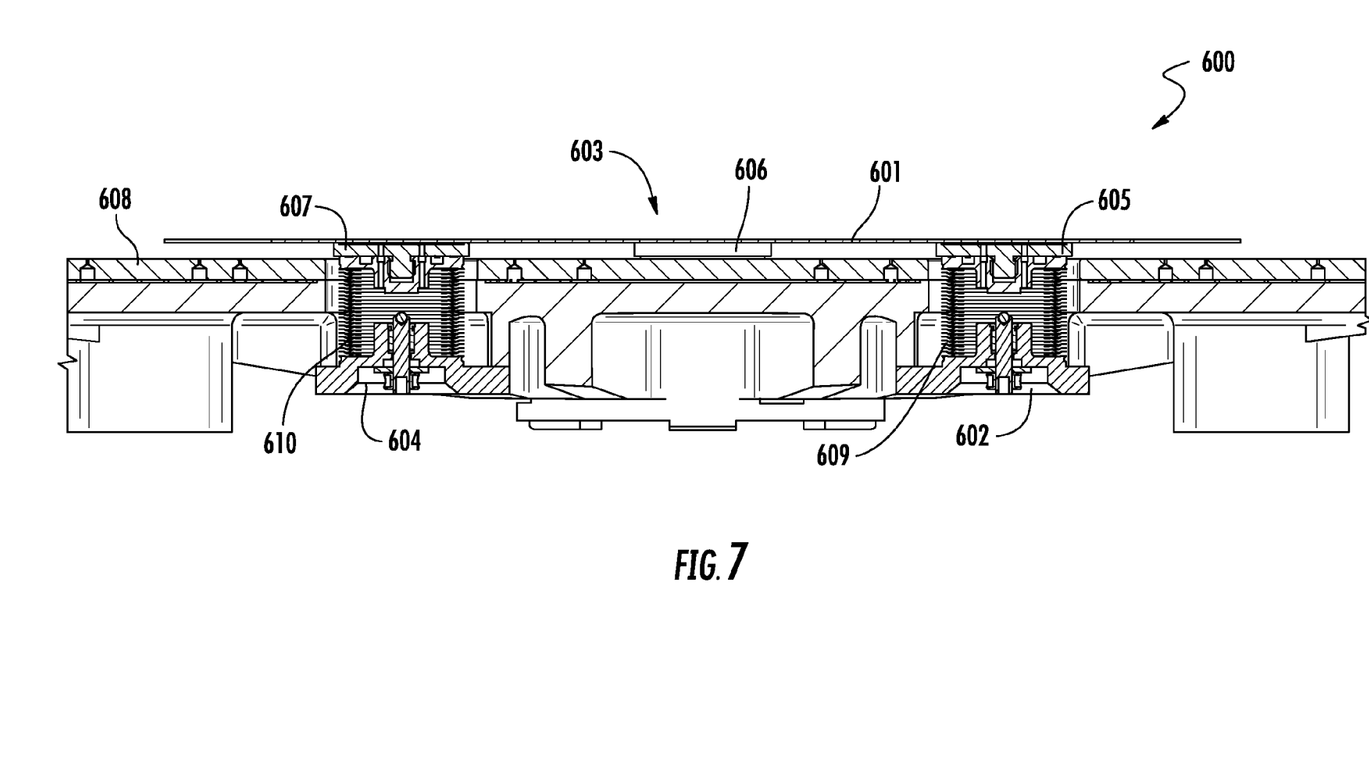
FIG. 7 is a cross-sectional view of a vacuum chuck having multiple suction assemblies in a first position.

FIGS. 6 and 7 are cross-sectional views of a vacuum chuck 600 having a suction assembly or suction assemblies in a first position. The wafer surface of the wafer 601 is positioned in contact with the suction assemblies 602-604. Each of the suction assemblies 602-604 can correspond to the suction assembly 100 of FIG. 1 or may have other configurations. While illustrated as planar, the wafer 601 can be non-planar. Each of the pads 605-607 contacts the wafer surface of the wafer 601. In FIGS. 6 and 7, suction may not yet be applied to the suction assemblies 602-604 or the suction applied to the suction assemblies 602-604 may not be high enough or applied long enough that the wafer 601 has been drawn into contact with the chucking surface 608 of the vacuum chuck 600 due to retraction of the bellows, such as the bellows 609 and 610 in FIGS. 6 and 7.

In one particular embodiment, a vacuum chuck includes three suction assemblies. Each suction assembly can protrude above the chucking surface of the vacuum chuck from a fraction of a millimeter to a dozen millimeters or more. In a first position, the pads protrude above the chucking surface of the vacuum chuck by, for example, approximately 6 mm. The bellows retracts such that, for example, the pads are flush with the chucking surface of the vacuum chuck.

The height of the bellows, such as bellows 609 and 610, or the distance one or more pads, such as the pads 605-607, are positioned from the chucking surface when the bellows are at rest can be controlled individually or in one or more groups. For example, a pad can be changed or modified to provide a different size channel. Changes to or swapping of the bellows may not be necessary.

Figure 8:
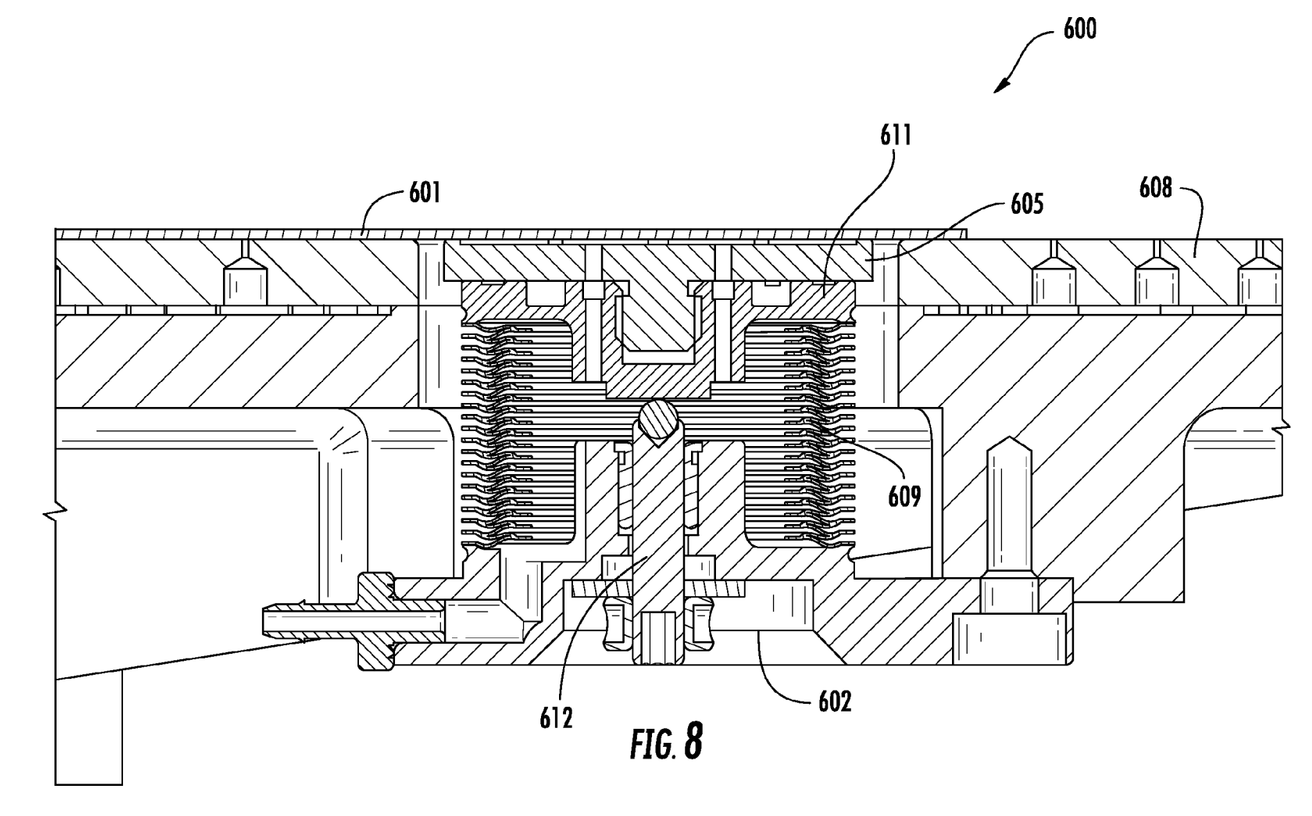
FIG. 8 is a cross-sectional view of a suction assembly in a vacuum chuck in a second position.
Figure 9:
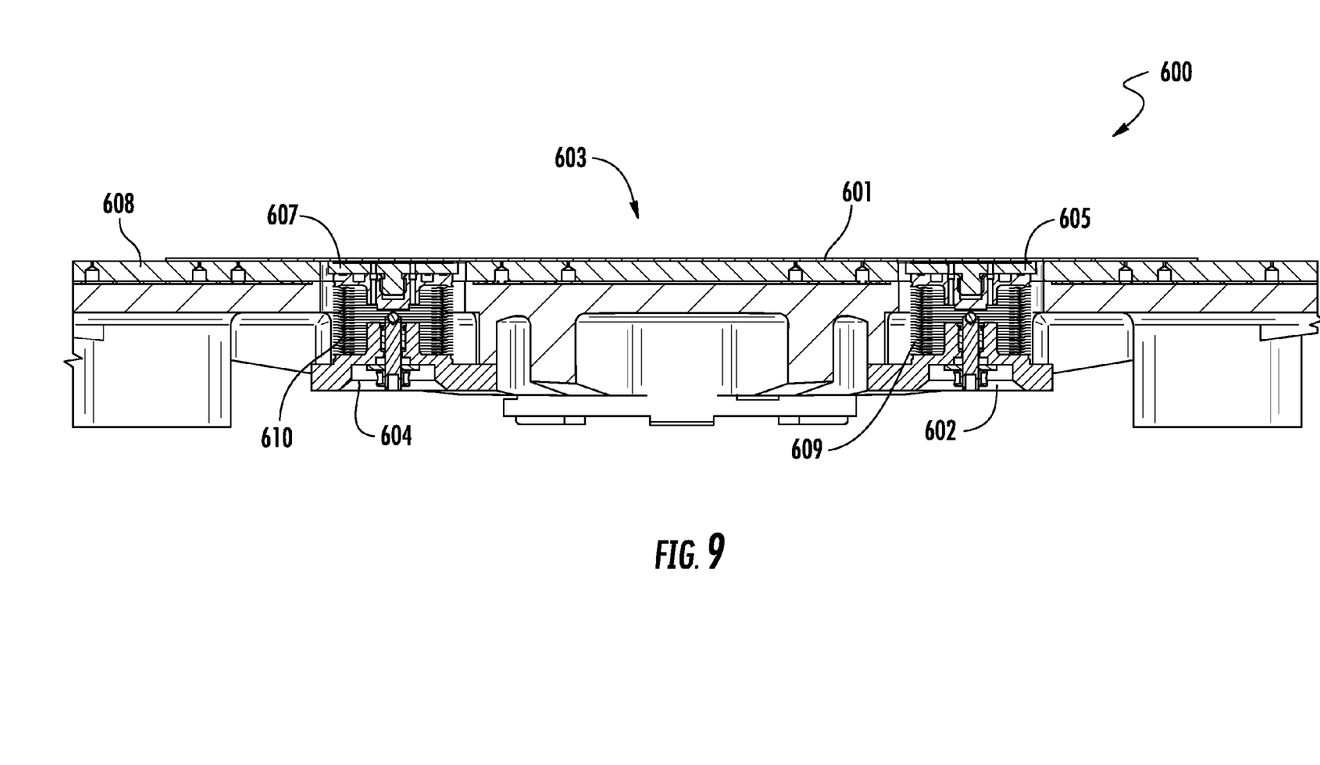
FIG. 9 is a cross-sectional view of a vacuum chuck having multiple suction assemblies in a second position.

FIGS. 8 and 9 are cross-sectional views of a vacuum chuck 600 having a suction assembly or suction assemblies in a second position. In comparing FIGS. 6 and 8 and FIGS. 7 and 9, the pads 605-607 are more proximate the chucking surface 608 in the second position than in the first position.

The bellows, such as the bellows 609 and 610, retract due to a lower pressure formed therein, which lowers the pads 605-607 from the first position in FIGS. 6 and 7 to the second position in FIGS. 8 and 9. The pads 605-607 engage with the wafer surface of the wafer 601. This engagement is maintained as the bellows, such as bellows 609 and 610, retract.

In this second position, the pads 605-607 may be flush with the chucking surface 608, though the pads 605-607 also may be above the chucking surface 608 in the second position. The wafer 601 may be in contact with the chucking surface 608 in the second position or may still be above the chucking surface 608 in the second position. If the wafer 601 is above the chucking surface 608 in the second position, the wafer 601 may be proximate enough the chucking surface 608 that the suction forces of the vacuum chuck 600 may be sufficient to clamp or secure the wafer 601 and pull the wafer 601 flat against the chucking surface 608. In one example, this can further retract the bellows to render the pads flush with the chucking surface 608.

FIGS. 8 and 9 illustrate contact between the floating part 611 and stop screw 612 when the pads 605-607 are in the second position. However, there may be a gap between the floating part 611 and stop screw 612 when the pads 605-607 are in the second position.

The force provided by the suction assemblies can vary. Depending on the wafer stiffness, the suction force provided by a suction assembly can be from less than approximately 1 N to approximately 200 N, including all values and ranges therebetween. In an example, the suction assemblies 602-604 can provide approximately 44 N of force on the wafer 601. The total suction force from the vacuum chuck may be calculated by the pressure multiplied by the net suction area. For example, a 300 mm wafer can see a force of as much as 7162 N (1 atm or 0.101325 N/mm$^2$ multiplied by A=π150$^2$).

Multiple groups of one or more suction assemblies may be used. Each of these groups can have a first position at a different height. These different heights can be configured based on the shape of the wafer surface or to minimize stress on the wafer caused by the suction assemblies.

Individual suction assemblies or groups of suction assemblies can be activated separately or during different time periods. Valves can activate suction to particular suction assemblies or groups of suction assemblies based on, for example, geometric shape of the wafer warpage or wafer stiffness. The valves can be activated to optimally flatten the wafer against the chucking surface.

The placement, number, or grouping of the suction assembly or suction assemblies can be optimized for a particular wafer. For example, wafer diameter, thickness, stiffness, or warpage can affect such placement, number, or grouping.

Different wafers can have different degrees of warpage, shapes, or surface finishes. Each stop screw may be individually adjusted for each wafer. To adjust the stop screws, a lock nut may be loosened, the screw may be adjusted using an Allen wrench, and the lock nut may be tightened.

The suction assemblies and vacuum chuck disclosed herein can be used to clamp wafers with devices formed on the backside. Contact still occurs between the pad and the wafer surface, but the material of the pad is configured to lessen the risk of damage to the devices.

A vacuum chuck also can use electrostatic chucking, such as Coulombic or Johnson-Rahbeck forces, to partly retain or secure a wafer. This may be supplementary to the vacuum forces. In another embodiment, the suction assemblies disclosed herein can be used with a chuck that only performs electrostatic chucking. The vacuum pump in this embodiment is only connected to the one or more suction assemblies.

The system and method described herein may be used for chucking any type of wafer. For example, the wafer may be a semiconductor wafer or another type of wafer, such as those used to manufacture LEDs, solar cells, magnetic discs, flat panels, or polished plates. Other objects also may be chucked, as is known to those skilled in the art. Embodiments of the present disclosure can be configured to chuck wafers that may be generally circular, generally rectangular, or other shapes. For example, the wafer may be a generally circular semiconductor wafer. Embodiments may be configured to chuck wafers of different sizes. In some embodiments, the wafer may have a diameter such as 100 mm, 200 mm, 300 mm, or 450 mm and a thickness from approximately 500 µm to 1,000 µm. In other examples, the wafer may be a generally rectangular solar cell that has dimensions from approximately 100 mm to 200 mm square and a thickness from approximately 150 µm to 300 µm.

Use of one or more suction assemblies, as disclosed herein, can chuck wafers with approximately 5 mm warpage. In one example, use of multiple suction assemblies can chuck a wafer with approximately 10 mm warpage. The wafer can be flattened within, for example, approximately 5 µm or less.

Use of one or more suction assemblies, as disclosed herein, can chuck wafers with bowl-shaped or with irregular warpage patterns. For example, potato chip-shaped or flower-shaped warpage can be chucked using an embodiment of the system disclosed herein. This was not previously possible to perform effectively.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A vacuum chuck comprising:
    a body defining a chucking surface and having a suction assembly opening defined by the chucking surface;
    a suction assembly disposed in the suction assembly opening, wherein the suction assembly comprises:
        a base;
        a bellows having a first end and a second end opposite the first end, wherein the second end of the bellows is disposed on the base;
        a pad having a first surface and a second surface opposite the first surface, wherein the second surface of the pad is disposed on the first end of the bellows, wherein the first surface defines a recess in the pad, the pad further comprising at least one channel between the first surface and second surface, the channel being defined by a channel wall;
        a vacuum port in fluid communication with a first volume and a second volume, wherein the first volume is defined by the base, the bellows, and the pad, and wherein the second volume is defined partly by the recess; and
        a spring inside the bellows disposed between the base and the pad;
    wherein the first surface of the pad is a distance from the chucking surface in a first position and the first surface of the pad is more proximate the chucking surface in a second position than in the first position.

2. The vacuum chuck of claim 1, further comprising a plurality of the suction assembly openings and a plurality of the suction assemblies disposed in the suction assembly openings.

3. The vacuum chuck of claim 1, further comprising a floating part disposed between the bellows and the pad, wherein the floating part includes a floating part channel through a floating part body of the floating part defined by a floating part channel wall, wherein the floating part channel is in fluid communication with the channel of the pad, and wherein the first volume is further defined by the floating part.

4. The vacuum chuck of claim 1, wherein the pad is fabricated of a polyimide.

5. The vacuum chuck of claim 1, wherein the bellows is fabricated of stainless steel.

6. The vacuum chuck of claim 1, further comprising a stop screw disposed in the base, wherein the stop screw is adjustable and wherein the stop screw is configured to provide a stop for the pad when the bellows retracts to the second position.

7. The vacuum chuck of claim 1, wherein the first surface of the pad is flush with the chucking surface in the second position.

8. The vacuum chuck of claim 1, wherein a cross-sectional area of the bellows is greater than a cross-sectional area of the pad.

9. The vacuum chuck of claim 8, wherein a ratio of the cross-sectional area of the bellows to the cross-sectional area of the pad is from 1.1:1 to 1.5:1.

* * * * *